United States Patent
Tsai et al.

(10) Patent No.: US 10,991,726 B2
(45) Date of Patent: Apr. 27, 2021

(54) PIXEL ARRAY SUBSTRATE

(71) Applicant: Au Optronics Corporation, Hsinchu (TW)

(72) Inventors: Yao-Jiun Tsai, Kaohsiung (TW); Ming-Hung Chuang, Tainan (TW)

(73) Assignee: Au Optronics Corporation, Hsinchu (TW)

( * ) Notice: Subject to any disclaimer, the term of this patent is extended or adjusted under 35 U.S.C. 154(b) by 35 days.

(21) Appl. No.: 16/451,020

(22) Filed: Jun. 25, 2019

(65) Prior Publication Data
US 2020/0273884 A1 Aug. 27, 2020

(30) Foreign Application Priority Data
Feb. 22, 2019 (TW) .................................. 108106021

(51) Int. Cl.
*H01L 27/12* (2006.01)
*G02F 1/1362* (2006.01)
*G06F 3/041* (2006.01)
*G02F 1/1333* (2006.01)
*G02F 1/1343* (2006.01)

(52) U.S. Cl.
CPC ...... *H01L 27/124* (2013.01); *G02F 1/136286* (2013.01); *G06F 3/0412* (2013.01); *G02F 1/13338* (2013.01); *G02F 1/134363* (2013.01); *G02F 2201/121* (2013.01); *G02F 2201/123* (2013.01)

(58) Field of Classification Search
None
See application file for complete search history.

(56) References Cited

U.S. PATENT DOCUMENTS

| | | | | |
|---|---|---|---|---|
| 8,890,181 | B2* | 11/2014 | Wang | G07F 17/32 |
| | | | | 257/88 |
| 2008/0117497 | A1* | 5/2008 | Shimodaira | G02F 1/136286 |
| | | | | 359/296 |
| 2015/0355766 | A1 | 12/2015 | Kotani et al. | |
| 2017/0162637 | A1* | 6/2017 | Choi | G09G 3/3225 |
| 2018/0129111 | A1 | 5/2018 | Wu et al. | |
| 2019/0250746 | A1* | 8/2019 | Han | G06F 3/0412 |

FOREIGN PATENT DOCUMENTS

| | | |
|---|---|---|
| CN | 102183860 | 9/2011 |
| CN | 107342036 | 11/2017 |

* cited by examiner

*Primary Examiner* — Christopher R Lamb
(74) *Attorney, Agent, or Firm* — JCIPRNET

(57) ABSTRACT

A pixel array substrate includes a substrate, pixels, and connection wires. The substrate has a transparent window, a wire region, and an active region. The connection wires are disposed in the wire region. Each connection wire is electrically connected to first signal lines of the pixels respectively located on two opposite sides of the transparent window. The connection wires include first and second wire groups. The first wire group includes first connection wires. Each first connection wire has a first segment and a second segment. A first insulation layer is disposed between the first and second segments that are electrically connected to each other. The second wire group includes second connection wires. The first segments of the first connection wires and the second connection wires are overlapped, and the first insulation layer is disposed between the first segments of the first connection wires and the second connection wires.

11 Claims, 18 Drawing Sheets

PIXEL ARRAY SUBSTRATE

CROSS-REFERENCE TO RELATED APPLICATION

This application claims the priority benefit of Taiwan application serial no. 108106021, filed on Feb. 22, 2019. The entirety of the above-mentioned patent application is hereby incorporated by reference herein and made a part of this specification.

BACKGROUND

Technical Field

The disclosure relates to a pixel array substrate.

Description of Related Art

Display panels have become more and more widely used, such as home audio-visual entertainment, public information display billboards, e-sports displays, and portable electronic products. For instance, in order to make a display panel of the portable electronic product (e.g., a smart phone) have a high screen ratio, the manufacturer arranges the lens in the display area of the display panel, so that it is not necessary to set a border area on one side of the display panel.

From a user's point of view, the lens is surrounded by a plurality of pixels configured to perform a display function. To electrically connect the pixels on two opposite sides of the lens, a plurality of connection wires are required to be disposed around a transparent window corresponding to the lens. However, if the resolution of the display panel increases, the number of the connection wires increases in response thereto, whereby a width of a wire region where the connection wires are located cannot be reduced, and the visual effects of the display panel are deteriorated.

SUMMARY

The disclosure provides a pixel array substrate, and a display panel manufactured with use of the pixel array substrate can achieve favorable visual effects.

In an embodiment of the disclosure, a pixel array substrate includes a substrate, a plurality of pixels, and a plurality of connection wires. The substrate has a transparent window, a wire region, and an active region, wherein the wire region is located around the transparent window, and the wire region is located between the active region and the transparent window. The pixels are disposed at the active region, wherein each of the pixels includes a first signal line, a second signal line, an active device, and a pixel electrode. The first signal line and the second signal line are interlaced, the active device is electrically connected to the first signal line and the second signal line, and the pixel electrode and the active device are electrically connected. The connection wires are disposed at the wire region, wherein each of the connection wires is electrically connected to a plurality of first signal lines of the pixels located at two opposite sides of the transparent window. The connection wires include a first wire group, the first wire group includes a plurality of first connection wires, each of the first connection wires has a first segment and a second segment, a first insulation layer is disposed between the first segment and the second segment, and the first segment and the second segment are electrically connected. The connection wires include a second wire group, and the second wire group includes a plurality of second connection wires. The first segment of one of the first connection wires and one of the second connection wires are overlapped, and the first insulation layer is disposed between the first segment of the one of the first connection wires and the one of the second connection wires are overlapped.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

It should be understood that when an element such as a layer, film, region or substrate is referred to as being "on" or "connected to" another element, it can be directly on or connected to the other element, or intervening elements may also be present. In contrast, when an element is referred to as being "directly on" or "directly connected to" another element, there is no intervening element present. As used herein, the term "connected" may refer to physically connected and/or electrically connected. Besides, "electrical connection" or "coupling" may be referred to as an intervening element existing between two elements.

The term "about," "approximately," "essentially" or "substantially" as used herein is inclusive of the stated value and means within an acceptable range of deviation for the particular value as determined by persons of ordinary skill in the art, considering the measurement in question and the error associated with measurement of the particular quantity (i.e., the limitations of the measurement system). For example, "about" may mean within one or more standard deviations, or within, for example, ±30%, ±20%, ±10%, ±5% of the stated value. Moreover, a relatively acceptable range of deviation or standard deviation may be chosen for the term "about," "approximately," "essentially" or "substantially" as used herein based on optical properties, etching properties or other properties, instead of applying one standard deviation across all the properties.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

Figure 1:
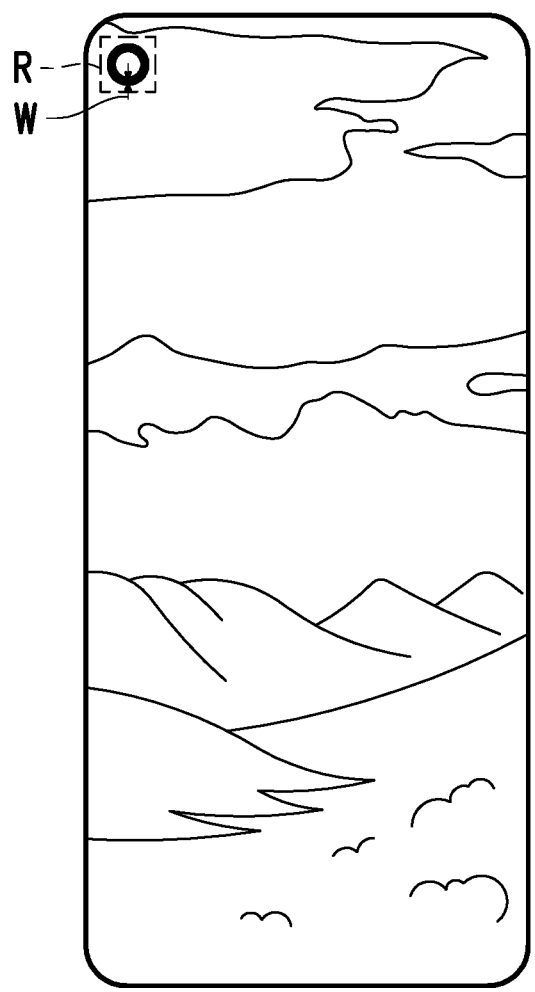
FIG. 1 is a schematic top view of a display panel 10 according to a first embodiment of the disclosure.
Figure 2:
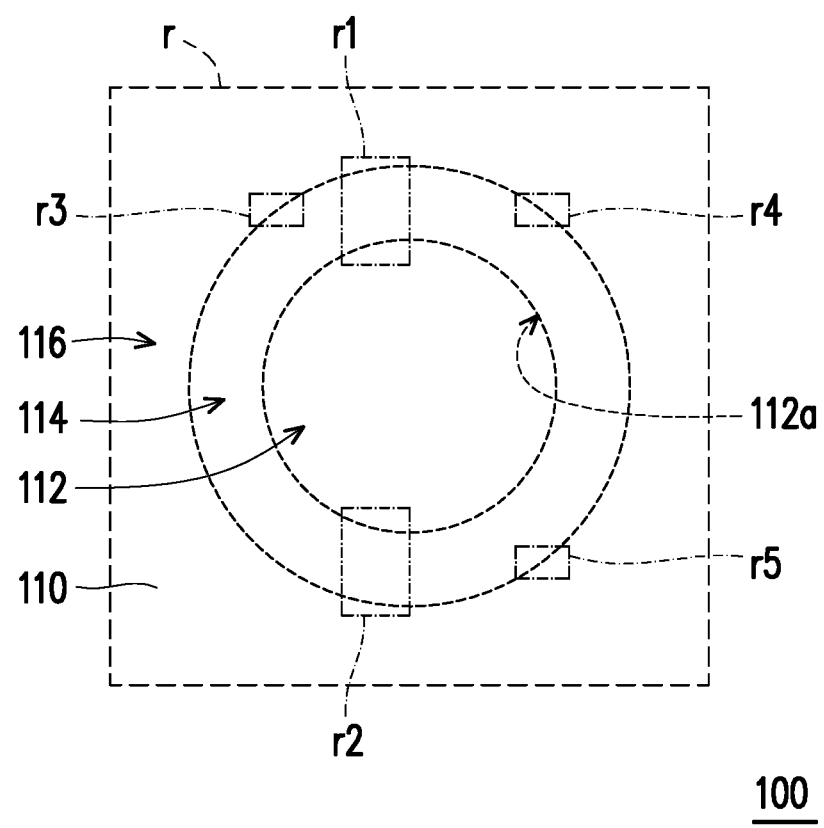
FIG. 2 is a schematic enlarged view of a portion r of the pixel array substrate 100 according to the first embodiment of the disclosure.

FIG. 1 is a schematic top view of a display panel 10 according to a first embodiment of the disclosure. FIG. 2 is a schematic enlarged view of a portion r of the pixel array substrate 100 according to the first embodiment of the disclosure. The portion r of the pixel array substrate 100 depicted in FIG. 2 corresponds to the portion R of the display panel 10 depicted in FIG. 1.

It should be mentioned that FIG. 2 illustrates a transparent window 112, a wire region 114, and an active region 116 of a substrate 110 of the pixel array substrate 100. Other small and delicate components of the pixel array substrate 100 are, for clear illustration not depicted in FIG. 2 but are illustrated in the enlarged FIG. 3 to FIG. 7.

Figure 3:
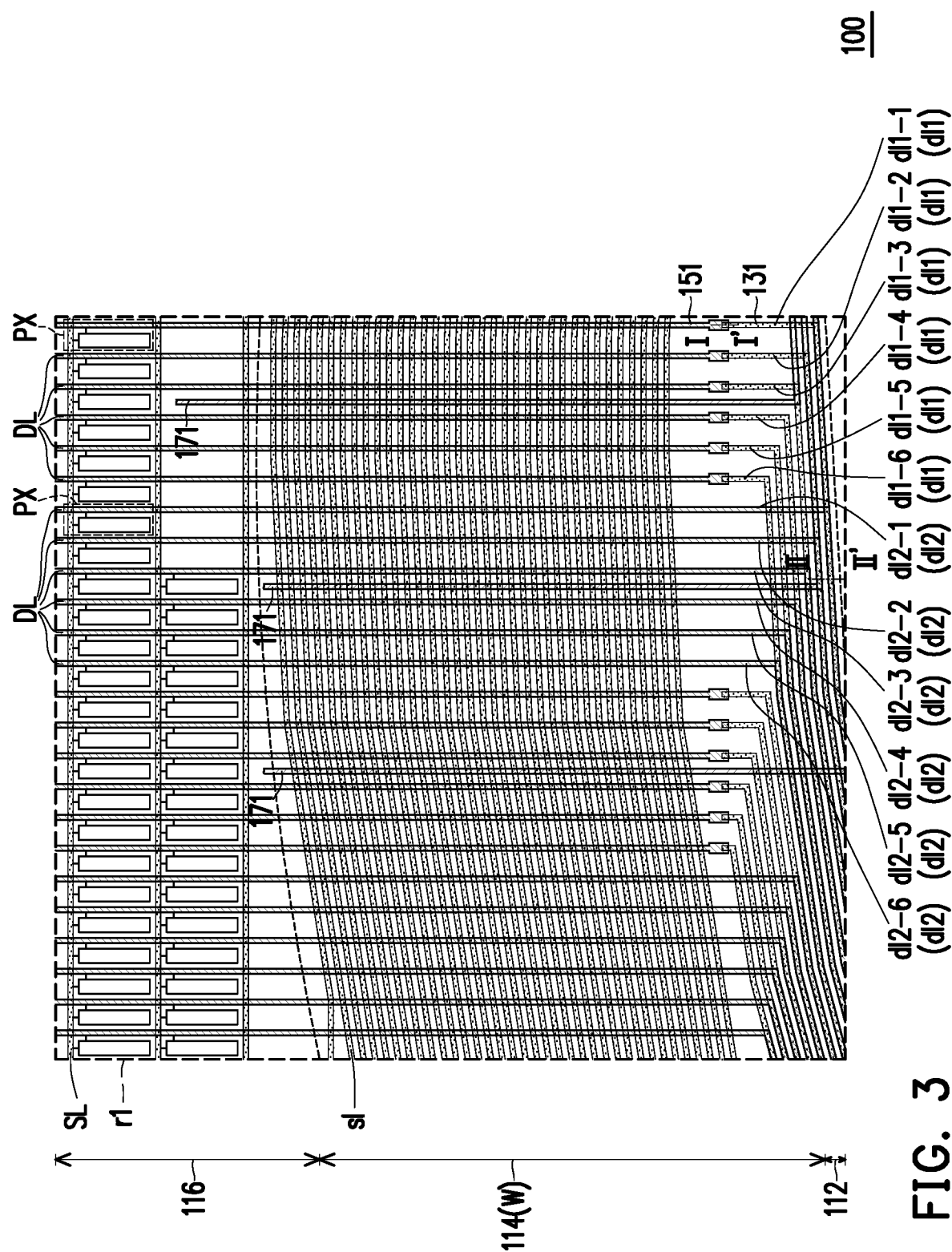
FIG. 3 is a schematic enlarged view of a region r1 of the pixel array substrate 100 depicted in FIG. 2.
Figure 4:
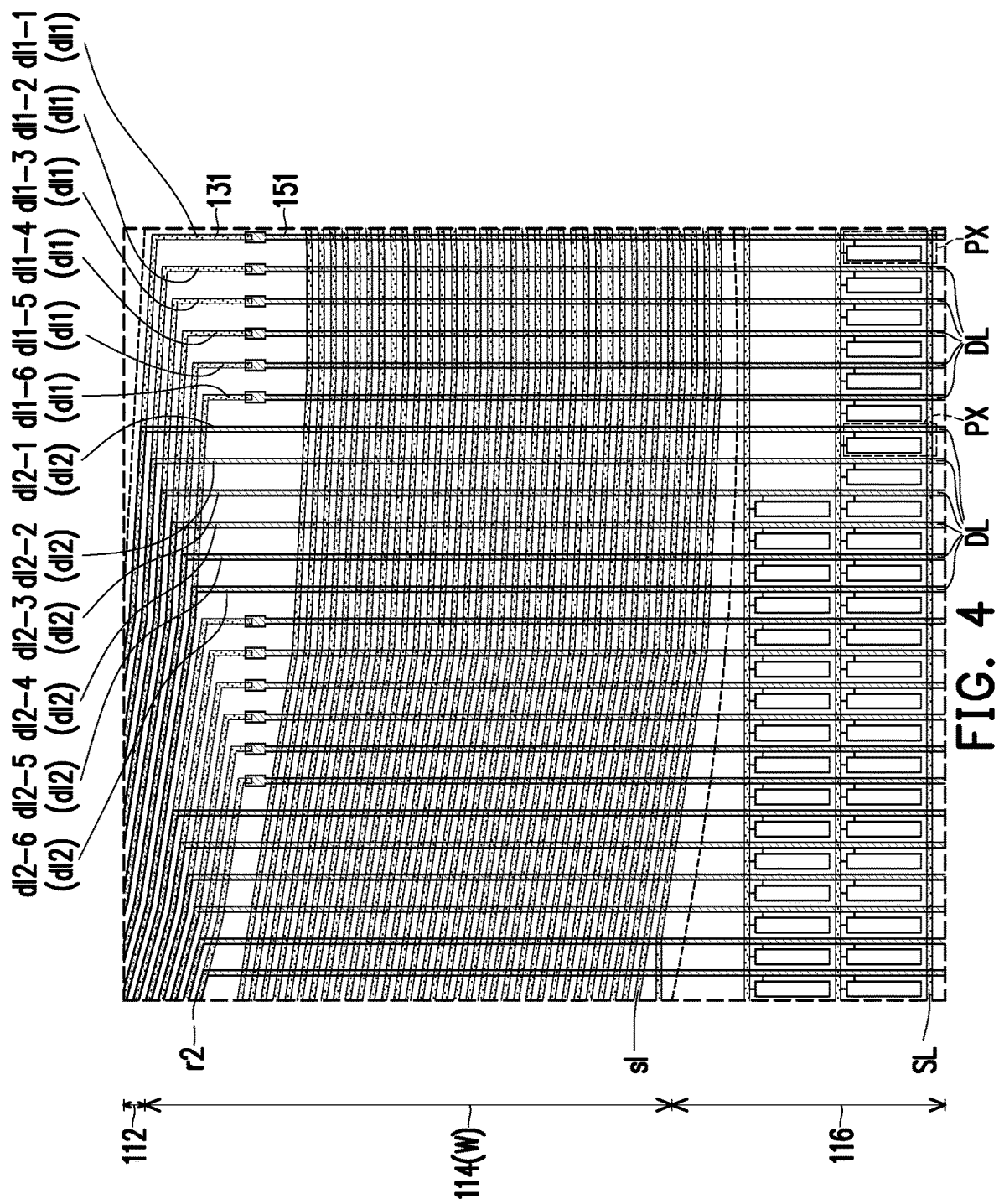
FIG. 4 is a schematic enlarged view of a region r2 of the pixel array substrate 100 depicted in FIG. 2.
Figure 5:
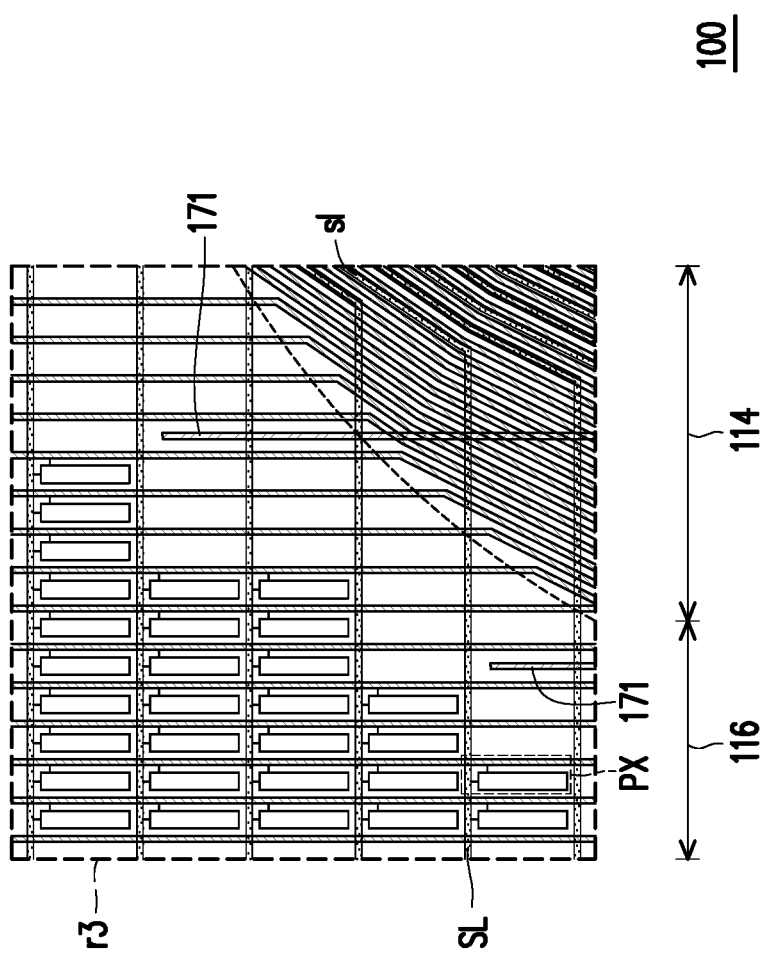
FIG. 5 is a schematic enlarged view of a region r3 of the pixel array substrate 100 depicted in FIG. 2.
Figure 6:
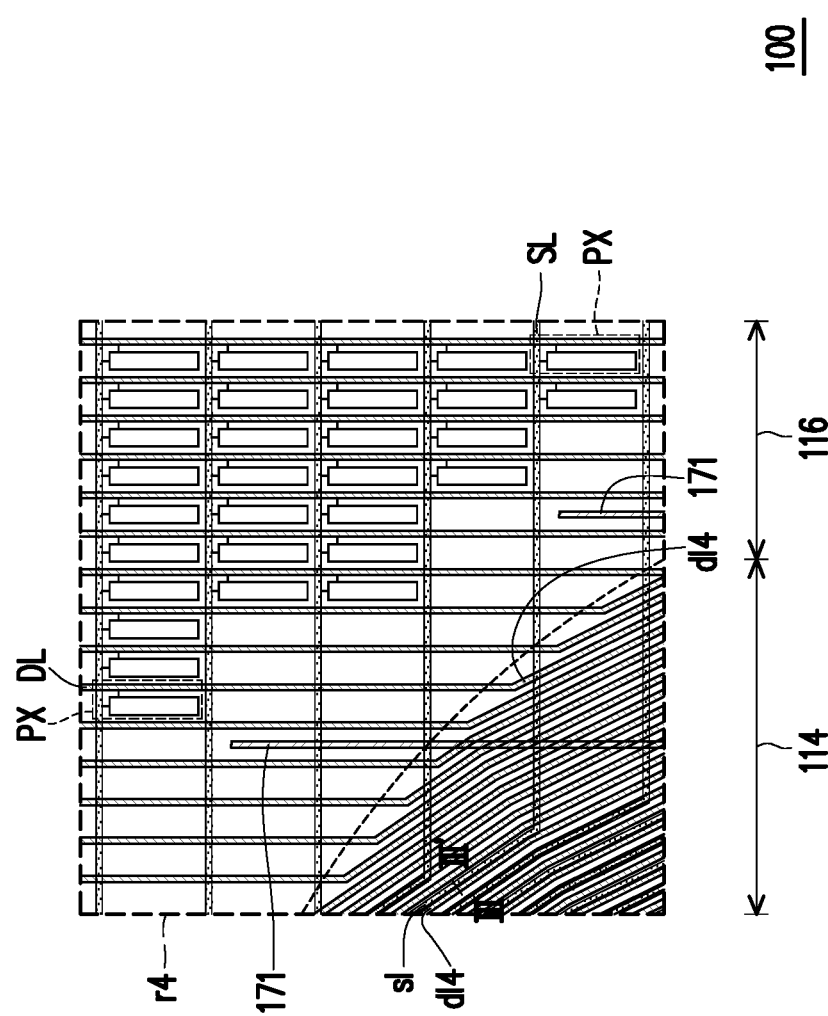
FIG. 6 is a schematic enlarged view of a region r4 of the pixel array substrate 100 depicted in FIG. 2.
Figure 7:
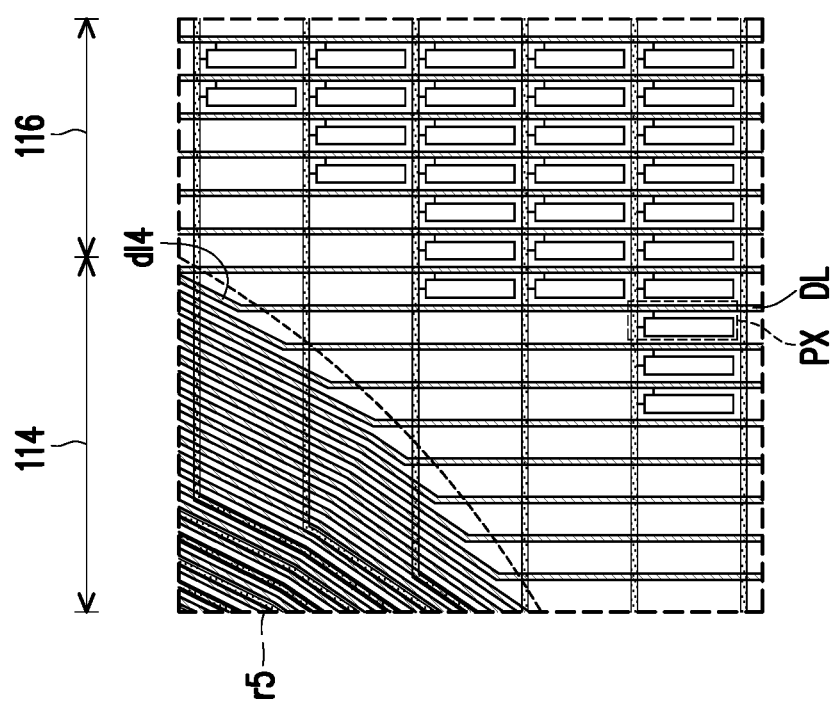
FIG. 7 is a schematic enlarged view of a region r5 of the pixel array substrate 100 depicted in FIG. 2.

FIG. 3 is a schematic enlarged view of a region r1 of the pixel array substrate 100 depicted in FIG. 2. FIG. 4 is a schematic enlarged view of a region r2 of the pixel array substrate 100 depicted in FIG. 2. FIG. 5 is a schematic enlarged view of a region r3 of the pixel array substrate 100 depicted in FIG. 2. FIG. 6 is a schematic enlarged view of a region r4 of the pixel array substrate 100 depicted in FIG. 2. FIG. 7 is a schematic enlarged view of a region r5 of the pixel array substrate 100 depicted in FIG. 2.

Figure 8:
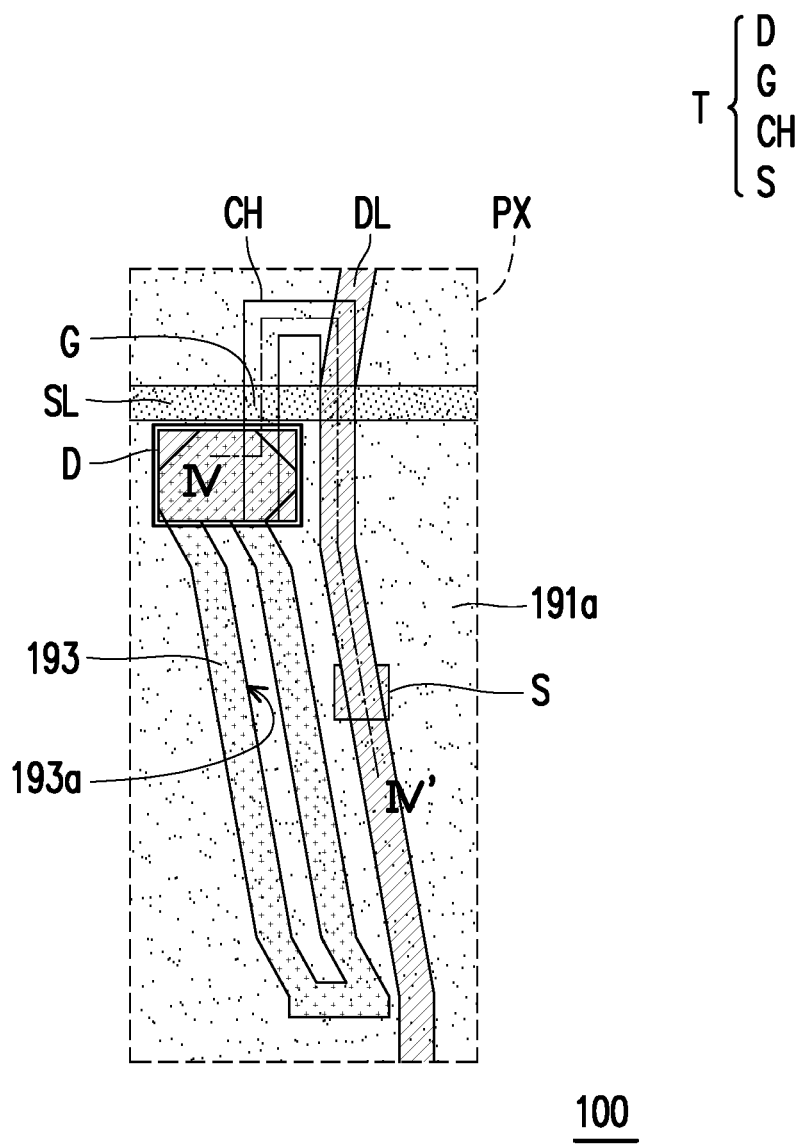
FIG. 8 is a schematic view of a layout of pixels PX of the pixel array substrate 100 according to the first embodiment of the disclosure.

It should be mentioned that FIG. 3 to FIG. 7 schematically illustrate pixels PX. FIG. 8 is a schematic view of a layout of pixels PX of the pixel array substrate 100 according to the first embodiment of the disclosure. FIG. 8 can be taken as a reference of the layout of the pixels PX depicted in FIG. 3 to FIG. 7. Besides, a touch trace 171 is omitted in FIG. 4 and FIG. 7.

Figure 9:
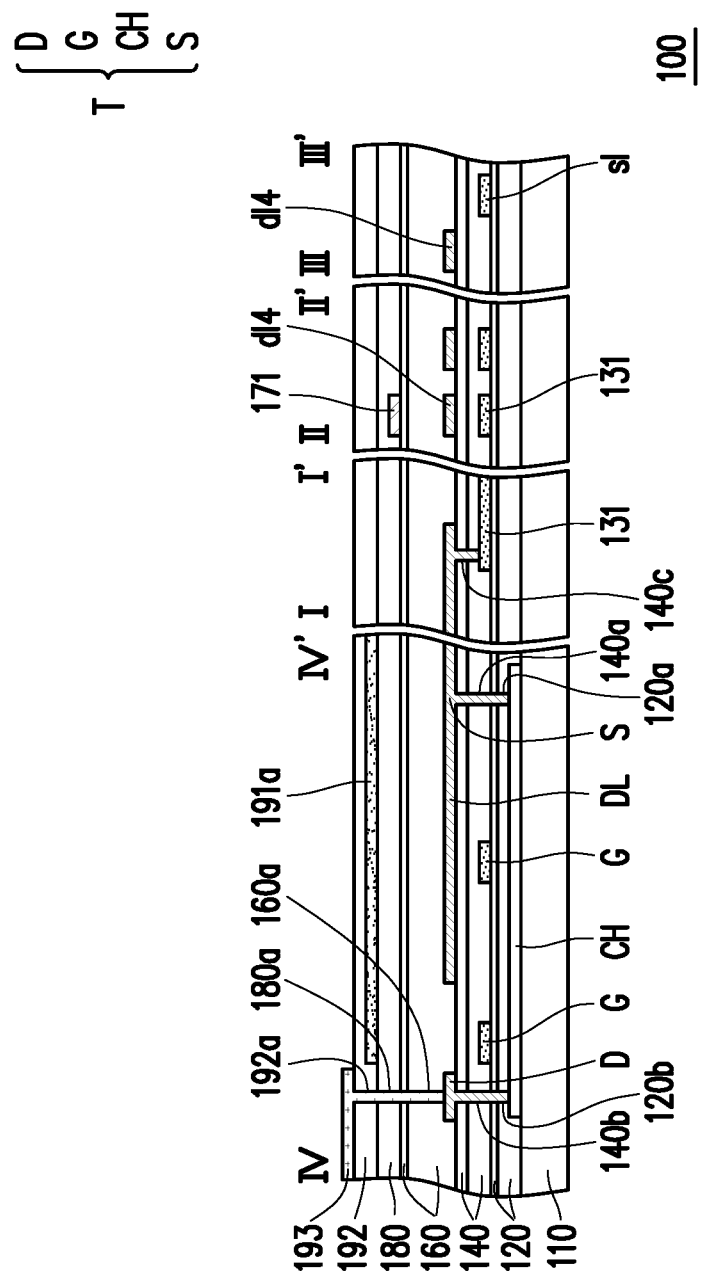
FIG. 9 is a schematic cross-sectional view of the pixel array substrate 100 according to the first embodiment of the disclosure.

FIG. 9 is a schematic cross-sectional view of the pixel array substrate 100 according to the first embodiment of the disclosure. FIG. 9 corresponds to sectional lines I-I' and II-II' in FIG. 3, a sectional line III-III' in FIG. 6, and a sectional line IV-IV' in FIG. 8. Besides, contact windows 120a, 120b, 140a, 140b, and 140c depicted in FIG. 9 are omitted in FIG. 3 to FIG. 8.

With reference to FIG. 1 and FIG. 2, a display panel 10 includes the pixel array substrate 100, an opposite substrate (not shown), and a display medium (not shown) disposed between the pixel array substrate 100 and the opposite substrate. For instance, in the present embodiment, the display medium may be liquid crystal. However, this should not be construed as a limitation in the disclosure; according to other embodiments, the display medium may also be an organic electroluminescent layer or another material.

With reference to FIG. 1 and FIG. 2, the substrate 110 of the pixel array substrate 100 has the transparent window 112, the wire region 114, and the active region 116. The wire region 114 is located around the transparent window 112, and the wire region 114 is located between the active region 116 and the transparent window 112. For instance, in the present embodiment, the transparent window 112 can be a through hole of the substrate 110, and a lens (not shown) is configured in or below the through hole. However, this should not be construed as a limitation in the disclosure. According to other embodiments, the transparent window 112 can also be a transparent material part of the substrate 110, and no light blocking pattern is disposed on the transparent material part. Additionally, in the present embodiment, a sealant surrounding the transparent window 112 can be disposed on the wire region 114; the active region 116 can also be referred to as a display region configured to accommodate a plurality of pixels PX (marked in FIG. 3).

With reference to FIG. 2, FIG. 3, and FIG. 8, the pixels PX are disposed at the active region 116. Each of the pixels PX includes a first signal line DL, a second signal line SL, an active device T, and a pixel electrode 193. The first signal line DL and the second signal line SL are interlaced, the active device T is electrically connected to the first signal line DL and the second signal line SL, and the pixel electrode 193 and the active device T are electrically connected.

With reference to FIG. 8 and FIG. 9, the active device T includes a thin film transistor (TFT) having a source S, a drain D, a gate G, and a semiconductor pattern CH. A gate insulation layer 120 is disposed between the gate G and the semiconductor pattern CH. The source S and the drain D are electrically connected to two different regions of the semiconductor pattern CH, respectively. The pixel electrode 193 is electrically connected to the drain D.

For instance, in the present embodiment, the first insulation layer 140 can be disposed on the gate G, the source S and the drain D can be disposed on the first insulation layer 140, the source S can be electrically connected to one region of the semiconductor pattern CH through the contact window 140a of the first insulation layer 140 and the contact window 120a of the gate insulation layer 120, and the drain D can be electrically connected to another region of the semiconductor pattern CH through another contact window 140b of the first insulation layer 140 and another contact window 120b of the gate insulation layer 120, which should however not be construed as limitations in the disclosure.

In the present embodiment, the pixel array substrate 100 further includes a second insulation layer 160 disposed on the source S and the drain D. The pixel array substrate 100 further includes a third insulation layer 180 disposed on the second insulation layer 160. Each of the pixels PX further includes a common electrode 191a. In the present embodiment, the common electrode 191a is selectively disposed on the third insulation layer 180, which should however not be construed as a limitation in the disclosure.

In the present embodiment, the pixel array substrate 100 further includes a fourth insulation layer 192, the fourth insulation layer 192 is disposed on the common electrode 191a, and the pixel electrode 193 is selectively disposed on the fourth insulation layer 192. For instance, in the present embodiment, the pixel electrode 193 can be electrically connected to the drain D through a contact window 192a of the fourth insulation layer 192, a contact window 180a of the third insulation layer 180, and a contact window 160a of the second insulation layer 160, which should however not be construed as a limitation in the disclosure.

In the present embodiment, the pixel electrode 193 is located above the common electrode 191a and has a plurality of slits 193a (marked in FIG. 8) which are overlapped with the common electrode 191a. However, this should not be construed as a limitation in the disclosure. According to other embodiments, the pixel electrode 193 may be located below the common electrode 191a, and the common electrode 191a may have the slits (not shown) overlapped with the pixel electrode 193.

With reference to FIG. 3 and FIG. 8, in the present embodiment, the first signal line DL and the source S are electrically connected, and the second signal line SL and the gate G are electrically connected. That is, the first signal line DL can be a data line, and the second signal line SL can be a scan line, which should however not be construed as limitations in the disclosure.

With reference to FIG. 2, FIG. 3, and FIG. 4, plural connection wires dl1 and dl2 are disposed at the wire region 114. Each of the connection wires dl1 and dl2 is electrically connected to a plurality of first signal lines DL of the pixels PX respectively located on two opposite sides (e.g., regions r1 and r2 on an upper side and a lower side of the transparent window 112) of the transparent window 112. With reference to FIG. 2, FIG. 6, and FIG. 7, plural connection wires dl4 are disposed at the wire region 114. Each of the connection wires dl4 is electrically connected to a plurality of first signal lines DL of the pixels PX respectively located on two opposite sides (e.g., regions r4 and r5 on an upper side and a lower side of the transparent window 112) of the transparent window 112.

With reference to FIG. 2, FIG. 3, FIG. 4, FIG. 6, and FIG. 7, in other words, the first signal lines DL of the pixels PX respectively located on two opposite sides of the transparent window 112 are electrically connected to each other through the connection wires dl1, dl2, and dl4 bypassing the transparent window 112. In the present embodiment, the connection wires dl1, dl2, and dl4 are substantially extended along an edge 112a of the transparent window 112. For instance, in the present embodiment, the transparent window 112 can appear to be of a circular shape, while the connection wires dl1, dl2, and dl4 are substantially arc lines disposed beside the transparent window 112. However, this should not be construed as a limitation in the disclosure. According to other embodiments, the connection wires dl1, dl2, and dl4 can be changed to be in other forms in response to the shape of the transparent window 112.

With reference to FIG. 2, FIG. 3, FIG. 4, and FIG. 9, the connection wires dl1 and dl2 include a plurality of first wire groups. Each of the first wire groups includes a plurality of first connection wires dl1, each of the first connection wires dl1 has a first segment 131 and a second segment 151, a first insulation layer 140 is disposed between the first segment 131 and the second segment 151, and the first segment 131 and the second segment 151 can be electrically connected through the contact window 140c of the first insulation layer 140.

For instance, in the present embodiment, the second segment 151 of the first connection wire dl can be considered as an extension of the first signal line DL, and the second segment 151 of the first connection wire dl and the first signal line DL can be formed in one second metal layer; the first segment 131 of the first connection wire dl can be considered as a main portion of the first connection wire dl and can bypass the transparent window 112, and the first segment 131 of the first connection wire dl and the second signal line SL can be formed in one first metal layer, which should however not be construed as limitations in the disclosure.

The connection wires dl1 and dl2 further include a plurality of second wire groups. Each of the second wire groups includes a plurality of second connection wires dl2. The first insulation layer 140 is disposed between the first segment 131 of the first connection wire dl1 and the second connection wire dl2. For instance, in the present embodiment, the entire first connection wire dl2 can be in one film layer (including but not limited to the second metal layer).

With reference to FIG. 3, in the present embodiment, the first wire groups including the first connection wires dl1 and the second wire groups including the second connection wires dl2 are substantially disposed at a portion of the wire region 114 closer to the transparent window 112. That is, the first wire groups including the first connection wires dl1 and the second wire groups including the second connection wires dl2 are substantially disposed at the inner ring of the wire region 114. The first wire groups including the first connection wires dl1 and the second wire groups including the second connection wires dl2 can be alternately arranged substantially along the edge 112a (marked in FIG. 2) of the transparent window 112, which should however not be construed as a limitation in the disclosure.

Note that the first segment 131 of one of the first connection wires dl1 and one of the second connection wires dl2 are overlapped. In the present embodiment, the first segment 131 of one of the first connection wires dl1 and one portion of one of the second connection wires dl2 are substantially aligned.

For instance, in the present embodiment, the first wire group can include a plurality of first connection wires dl1-1, dl1-2, dl1-3, dl1-4, dl1-5, and dl1-6 sequentially arranged along the edge 112a of the transparent window 112, and the second wire group can include a plurality of second connection wires dl2-1, dl2-2, dl2-3, dl2-4, dl2-5, and dl2-6 sequentially arranged along the edge 112a of the transparent window 112. The first segments 131 of the first connection wires dl1-1, dl1-2, dl1-3, dl1-4, dl1-5, and dl1-6 are respectively overlapped with the second connection wires dl2-1, dl2-2, dl2-3, dl2-4, dl2-5, and dl2-6. The first segments 131 of the first connection wires dl1-1, dl1-2, dl1-3, dl1-4, dl1-5, and dl1-6 and a plurality of portions of the second connection wires dl2-1, dl2-2, dl2-3, dl2-4, dl2-5, and dl2-6 can be substantially aligned.

Since the first segments 131 of the first connection wires dl1 and the second connection wires dl2 are overlapped, a width W of the wire region 114 configured to accommodate the connection wires dl1 and dl2 can be reduced, which is conducive to the improvement of visual effects and the increase in a screen ratio of the display panel 10 (marked in FIG. 1).

Besides, the wire region 114 can have a relatively large transparent region because the first segments 131 of the first connection wires dl1 and the second connection wires dl2 are overlapped. As such, when the pixel array substrate 100 is bonded to the opposite substrate (not shown) through the sealant (not shown) disposed on the wire region 114, and when it is intended to cure the sealant, the sealant on the wire region 114 can be better irradiated by beams, which increases the sealant curing rate and can thus improve reliability of the display panel 10.

In the present embodiment, note that one of the first connection wires dl1 and a corresponding one of the second connection wires dl2 are overlapped, the pixels PX electrically connected to the one of the first connection wires dl1 and the pixels PX electrically connected to the corresponding second connection wire dl2 are configured to display the same color, and a polarity of the one of the first connection wires dl1 is the same as a polarity of the corresponding second connection wire dl2.

For instance, the first connection wire dl1-1 and the corresponding second connection wire dl2-1 are overlapped, and the pixels PX electrically connected to the first connection wire dl1-1 and the pixels PX electrically connected to the second connection wire dl2-1 are configured to display a first color and have a first polarity; the first connection wire dl1-2 and the corresponding second connection wire dl2-2 are overlapped, and the pixels PX electrically connected to the first connection wire dl1-2 and the pixels PX electrically connected to the second connection wire dl2-2 are configured to display a second color and have a second polarity; the first connection wire dl1-3 and the corresponding second connection wire dl2-3 are overlapped, and the pixels PX electrically connected to the first connection wire dl1-3 and the pixels PX electrically connected to the second connection wire dl2-3 are configured to display a third color and have the first polarity; the first connection wire dl1-4 and the corresponding second connection wire dl2-4 are overlapped, and the pixels PX electrically connected to the first connection wire dl1-4 and the pixels PX electrically connected to the second connection wire dl2-4 are configured to display the first color and have the second polarity; the first connection wire dl1-5 and the corresponding second connection wire dl2-5 are overlapped, and the pixels PX electrically connected to the first connection wire dl1-5 and the pixels PX electrically connected to the second connection wire dl2-5 are configured to display the second color and have the first polarity; the first connection wire dl1-6 and the corresponding second connection wire dl2-6 are overlapped, and the pixels PX electrically connected to the first connection wire dl1-6 and the pixels PX electrically connected to the second connection wire dl2-6 are configured to display the third color and have the second polarity.

One of the first polarity and the second polarity is positive, while the other is negative. In the present embodiment, the first color, the second color, and the third color can include red, green, and blue, which should however not be construed as limitations in the disclosure.

Figure 10:
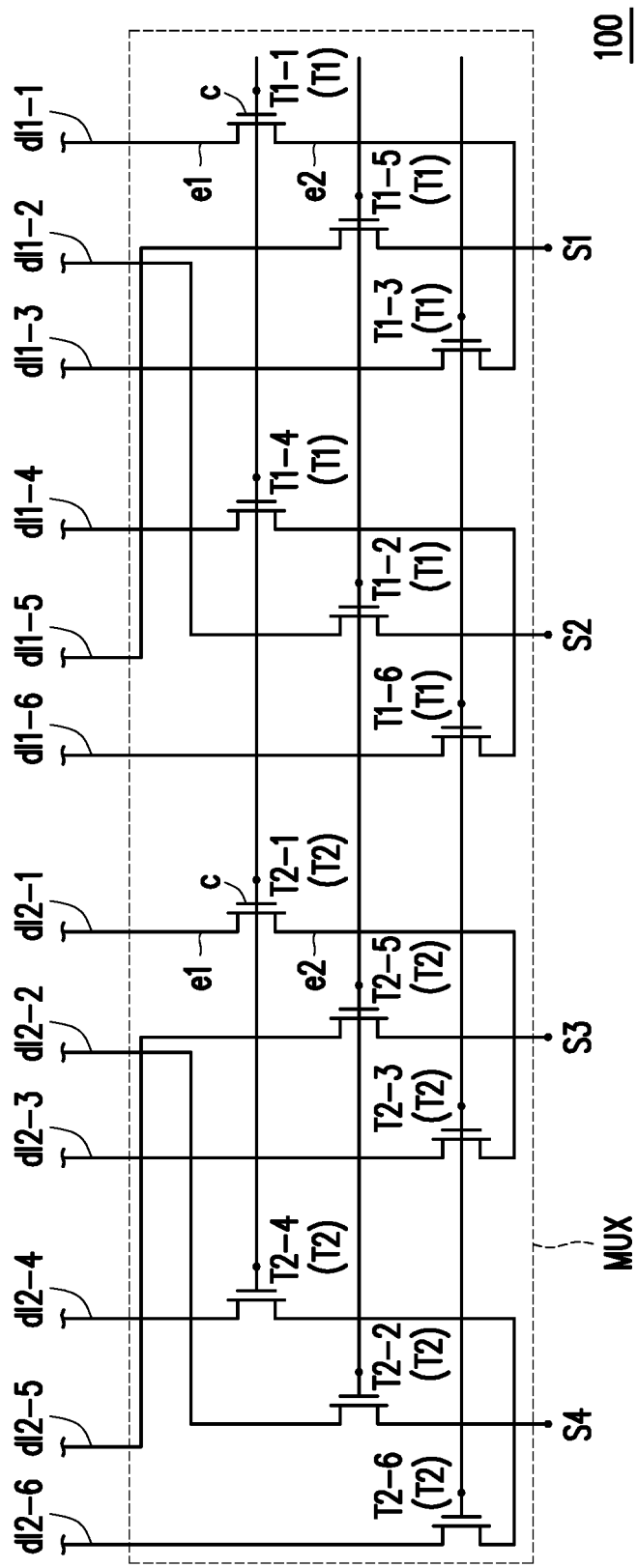
FIG. 10 is a schematic view of a multiplexer of the pixel array substrate according to the first embodiment of the disclosure.

FIG. 10 is a schematic view of a multiplexer of the pixel array substrate according to the first embodiment of the disclosure. With reference to FIG. 3 and FIG. 10, in the present embodiment, the pixel array substrate 100 selectively includes a multiplexer MUX. The multiplexer MUX is selectively disposed at a peripheral region (not shown) of the substrate 110, wherein the peripheral region is located outside the display region 116, and the display region 116 is located between the wire region 114 and the peripheral region.

The multiplexer MUX and the connection wires dl1 and dl2 are electrically connected. For instance, in the present embodiment, the multiplexer MUX includes a plurality of first transistors T1 and a plurality of second transistors T2, and each of the first transistors T1 and the second transistors T2 has a first terminal e1, a second terminal e2, and a control terminal c, wherein the first connection wires dl1 are electrically connected to the first terminals e1 of the first transistors T1, respectively, the second connection wires dl2 are electrically connected to the first terminals e1 of the second transistors T2, respectively, the control terminals c of the first transistors T1 are electrically connected to the control terminals c of the second transistors T2, and the second terminals e2 of the first transistors T1 and the second terminals e2 of the second transistors T2 are electrically connected to a plurality of signal terminals S1, S2, S3, and S4.

Specifically, the first connection wire dl1-1 is electrically connected to the first terminal e1 of the first transistor T1-1, the first connection wire dl1-4 is electrically connected to the first terminal e1 of the first transistor T1-4, the second connection wire dl2-1 is electrically connected to the first terminal e1 of the second transistor T2-1, the second connection wire dl2-4 is electrically connected to the first terminal e1 of the second transistor T2-4, the control terminals c of the first transistors T1-1 and T1-4 are electrically connected to the control terminals c of the second transistors T2-1 and T2-4, and the second terminal e2 of the first transistor T1-1, the second terminal e2 of the first transistor T1-4, the second terminal e2 of the second transistor T2-1, and the second terminal e2 of the second transistor T2-4 are electrically connected to the signal terminals S1, S2, S3, and S4, respectively.

The first connection wire dl1-2 is electrically connected to the first terminal e1 of the first transistor T1-2, the first connection wire dl1-5 is electrically connected to the first terminal e1 of the first transistor T1-5, the second connection wire dl2-2 is electrically connected to the first terminal e1 of the second transistor T2-2, the second connection wire dl2-5 is electrically connected to the first terminal e1 of the second transistor T2-5, the control terminals c of the first transistors T1-2 and T1-5 are electrically connected to the control terminals c of the second transistors T2-2 and T2-5, and the second terminal e2 of the first transistor T1-2, the second terminal e2 of the first transistor T1-5, the second terminal e2 of the second transistor T2-2, and the second terminal e2 of the second transistor T2-5 are electrically connected to the signal terminals S2, S1, S4, and, S3, respectively.

The first connection wire dl1-3 is electrically connected to the first terminal e1 of the first transistor T1-3, the first connection wire dl1-6 is electrically connected to the first terminal e1 of the first transistor T1-6, the second connection wire dl2-3 is electrically connected to the first terminal e1 of the second transistor T2-3, the second connection wire dl2-6 is electrically connected to the first terminal e1 of the second transistor T2-6, the control terminals c of the first transistors T1-3 and T1-6 are electrically connected to the control terminals c of the second transistors T2-3 and T2-6, and the second terminal e2 of the first transistor T1-3, the second terminal e2 of the first transistor T1-6, the second terminal e2 of the second transistor T2-3, and the second terminal e2 of the second transistor T2-6 are electrically connected to the signal terminals S1, S2, S3, and, S4, respectively.

In the present embodiment, it should be mentioned that a first data signal and a second data signal are simultaneously input to the first connection wire (e.g., dl1-1) and the second connection wire (e.g., dl2-1) which are overlapped. However, the pixels PX electrically connected to the first connection wire (e.g., dl1-1) and the second connection wire (e.g., dl2-1) which are overlapped are configured to display the same color, and the first connection wire (e.g., dl1-1) and the second connection wire (e.g., dl2-1) which are overlapped have the same polarity. Hence, the first data signal and the second data signal are not apt to interrupt each other, and a data coupling effect issue between the first connection wire (e.g., dl1-1) and the second connection wire (e.g., dl2-1) which are overlapped can be resolved to a better extent.

With reference to FIG. 2, FIG. 3, FIG. 5, and FIG. 6, the pixel array substrate 100 further includes a plurality of conductive wires sl disposed at the wire region 114, wherein each of the conductive wires sl is electrically connected to a plurality of second signal lines SL of the pixels PX respectively located on two opposite sides (e.g., the regions r4 and r5 on the upper side and the lower side of the transparent window 112).

In other words, the second signal lines SL of the pixels PX respectively located on two opposite sides of the transparent window 112 are electrically connected to each other through the conductive wires sl bypassing the transparent window 112. In the present embodiment, the conductive wires sl are substantially extended along the edge 112a of the transparent window 112. For instance, the transparent window 112 can appear to be of a circular shape, while the connection wires dl1, dl2, and dl4 are substantially arc lines disposed beside the transparent window 112. However, this should not be construed as a limitation in the disclosure. According to other embodiments, the conductive wires sl can be changed to be in other forms in response to the shape of the transparent window 112.

For instance, in the present embodiment, the conductive wires sl located in the wire region 114 can be considered as an extension of the second signal lines SL located at the active region 116, and the conductive wires sl and the second signal lines SL can be formed in one first metal layer, which should however not be construed as limitations in the disclosure.

With reference to FIG. 3 and FIG. 9, in the present embodiment, the first segments 131 and the second segments 151 of the first connection wires dl1 are electrically connected through the contact window 140c (depicted in FIG. 9), and an orthogonal projection of the contact window 140c on the substrate 110 is located between the transparent window 112 and a plurality of orthogonal projections of the conductive wires sl on the substrate 110. Namely, the contact window 140c can be disposed at the space between bent conductive wires sl and bent first segments 131, whereby the area occupied by the wire region 114 can be utilized in a more efficient manner, and the width W of the wire region 114 may be further reduced.

With reference to FIG. 2, FIG. 6, and FIG. 7, the connection wires dl1, dl2, and dl4 configured to electrically connect the first signal lines DL of the pixels PX respectively located on two opposite sides of the transparent window 112 further include a plurality of peripheral wires dl4.

With reference to FIG. 2, FIG. 3, and FIG. 6, an orthogonal projection of the first wire group including the first connection wires dl1 on the substrate 110 and an orthogonal projection of the second wire group including the second connection wires dl2 on the substrate are located between a plurality of orthogonal projections of the peripheral wires dl4 on the substrate 110 and the transparent window 112.

That is, in the present embodiment, the first wire group including the first connection wires dl1 and the second wire group including the second connection wires dl2 are substantially disposed at a portion of the wire region 114 closer to the transparent window 112 (i.e., disposed at the inner ring of the wire region 114), and the peripheral wires dl4 are substantially disposed at a portion of the wire region 114 farther away from the transparent window 112 (i.e., disposed at the outer ring of the wire region 114).

With reference to FIG. 6, in the present embodiment, the peripheral wires dl4 and the conductive wires sl can be overlapped. Specifically, in the present embodiment, pitches of the peripheral wires dl4 may be different from pitches of the conductive wires sl, and each of the peripheral wires dl4 and one corresponding conductive wire sl are selectively partially overlapped, which should however not be construed as a limitation in the disclosure.

With reference to FIG. 3, FIG. 8, and FIG. 9, in the present embodiment, the common electrodes 191a of the pixels PX can be connected to form a plurality of touch sensing pads, the pixel array substrate 100 further includes a plurality of touch traces 171, and the touch traces 171 and the touch sensing pads are electrically connected. For instance, in the present embodiment, the touch traces 171 can be disposed on the second insulation layer 160, and the third insulation layer 180 can be disposed on the touch traces 171; the touch traces 171 can be formed in a third metal layer, which should however not be construed as a limitation in the disclosure.

With reference to FIG. 3 and FIG. 9, in the present embodiment, at least one touch trace 171 can be overlapped with the first segment 131 of the first connection wire dl1 (e.g., dl1-2) and the second connection wire dl2 (e.g., dl2-2). That is, in the present embodiment, at least one touch trace 171 can be disposed above the connection wires dl1 and dl2, so that the arrangement of the touch traces 171 is not apt to be limited by the reduced width W of the wire region 114.

It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 11:
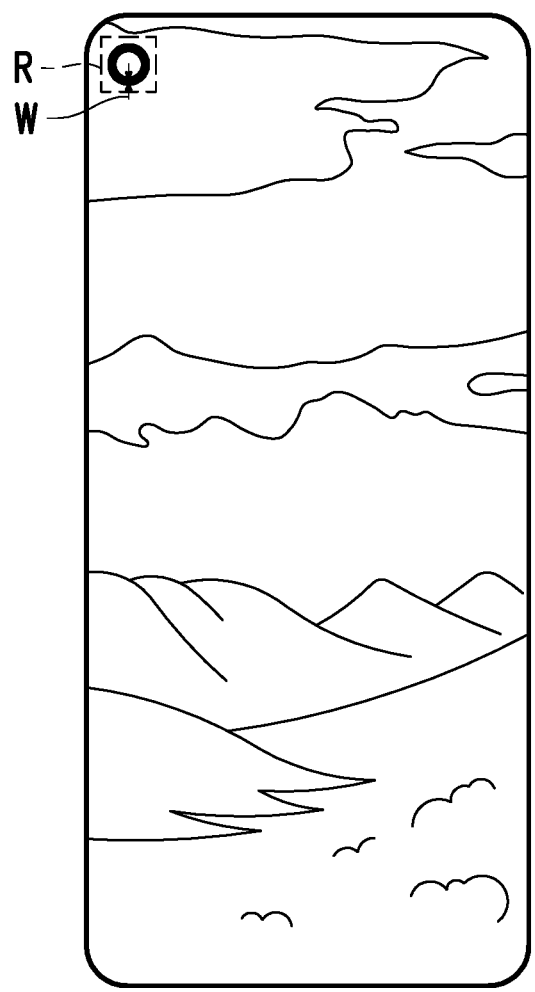
FIG. 11 is a schematic top view of a display panel 10A according to a second embodiment of the disclosure.
Figure 12:
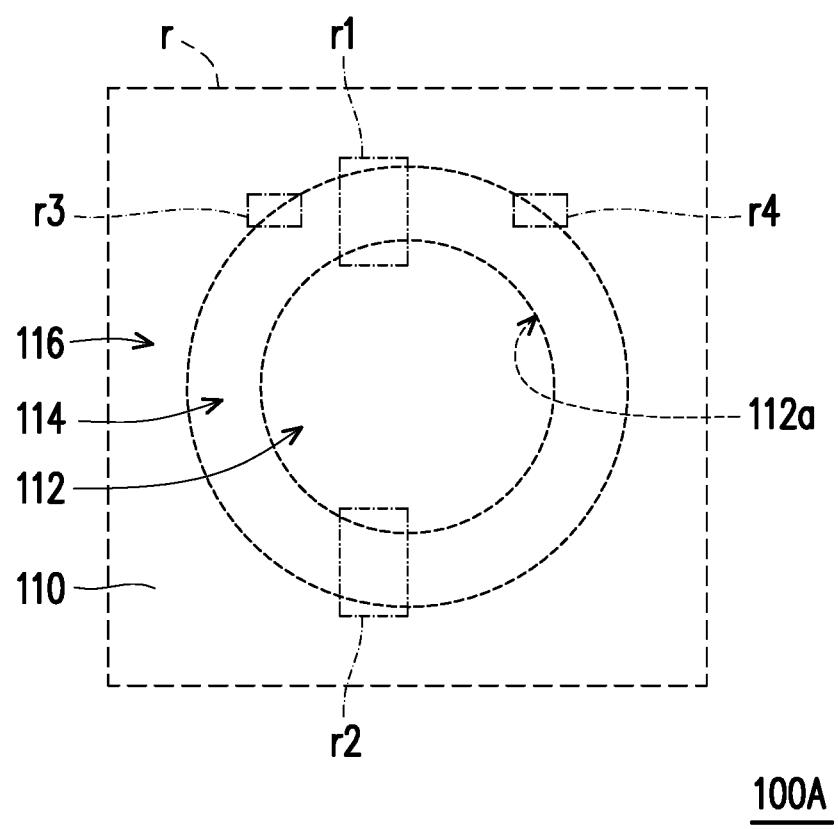
FIG. 12 is a schematic enlarged view of a portion r of the pixel array substrate 100A according to the second embodiment of the disclosure.

FIG. 11 is a schematic top view of a display panel 10A according to a second embodiment of the disclosure. FIG. 12 is a schematic enlarged view of a portion r of the pixel array substrate 100A according to the second embodiment of the disclosure. The portion r of the pixel array substrate 100A depicted in FIG. 12 corresponds to the portion R of the display panel 10A depicted in FIG. 11.

It should be mentioned that FIG. 12 illustrates the transparent window 112, the wire region 114, and the active region 116 of the substrate 110 of the pixel array substrate 100A. Other small and delicate components of the pixel array substrate 100A are, for clear illustration not depicted in FIG. 12 but are illustrated in the enlarged FIG. 13 to FIG. 16.

Figure 13:
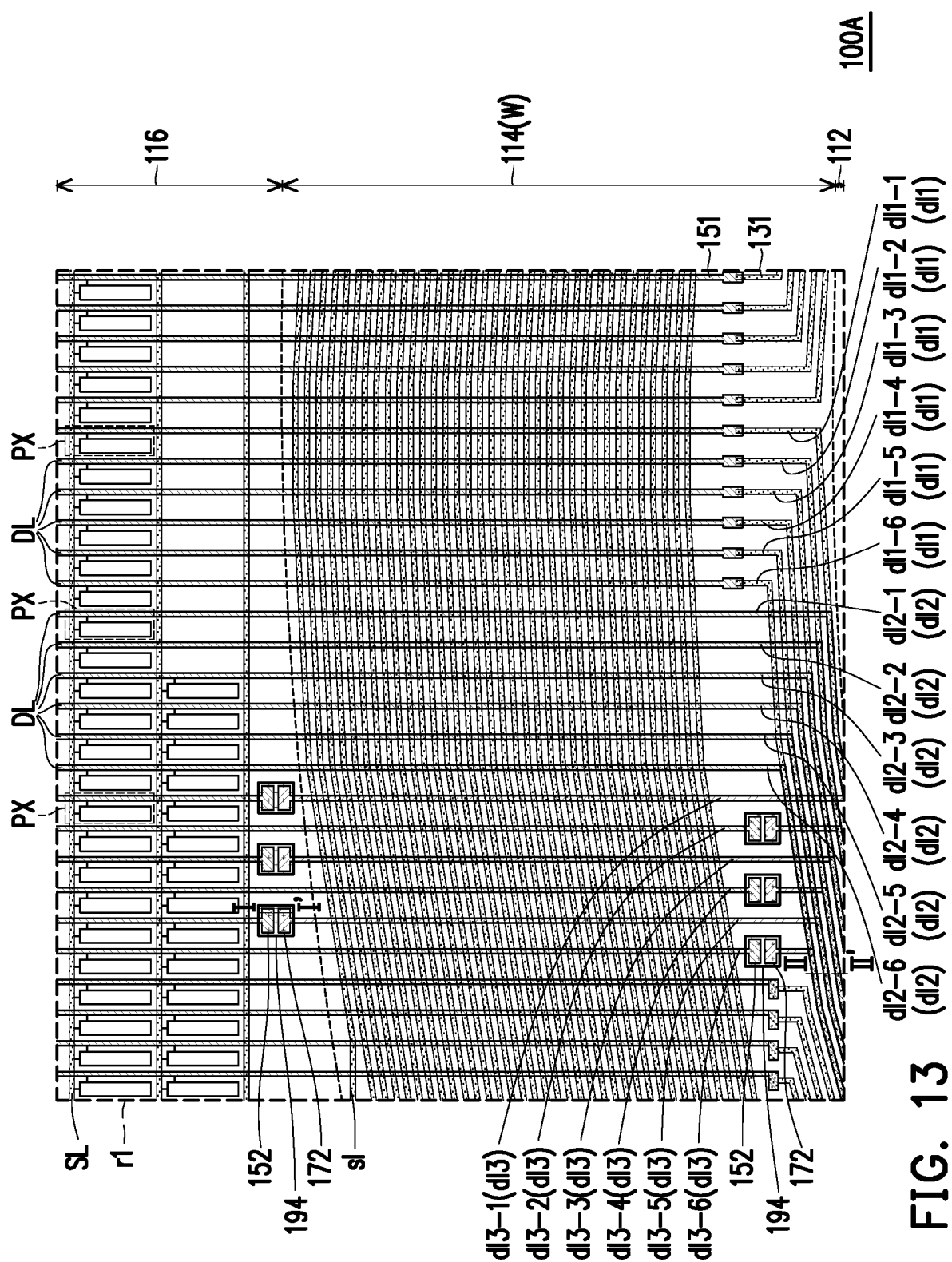
FIG. 13 is a schematic enlarged view of a region r1 of the pixel array substrate 100A depicted in FIG. 12.
Figure 14:
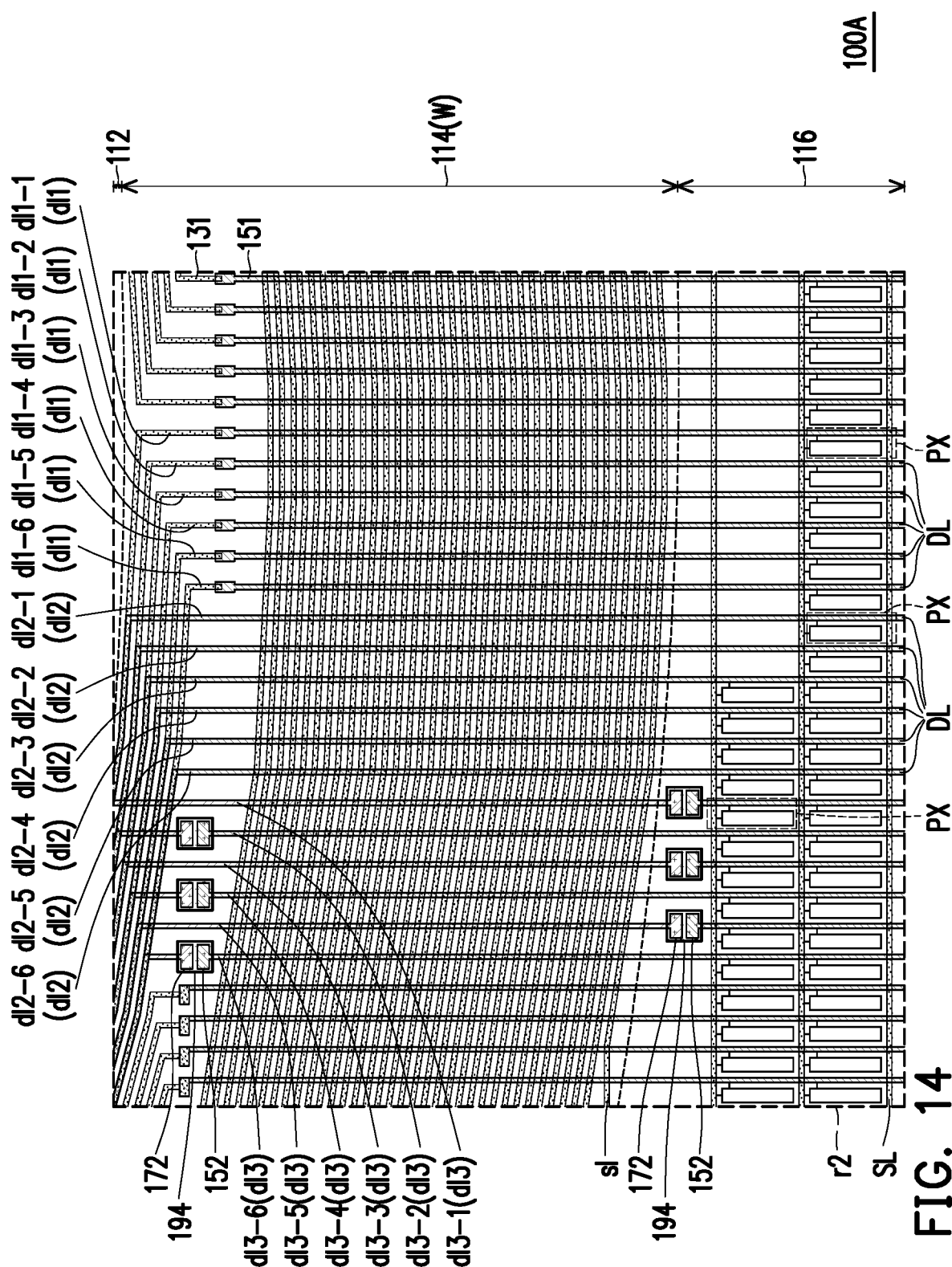
FIG. 14 is a schematic enlarged view of a region r2 of the pixel array substrate 100A depicted in FIG. 12.
Figure 15:
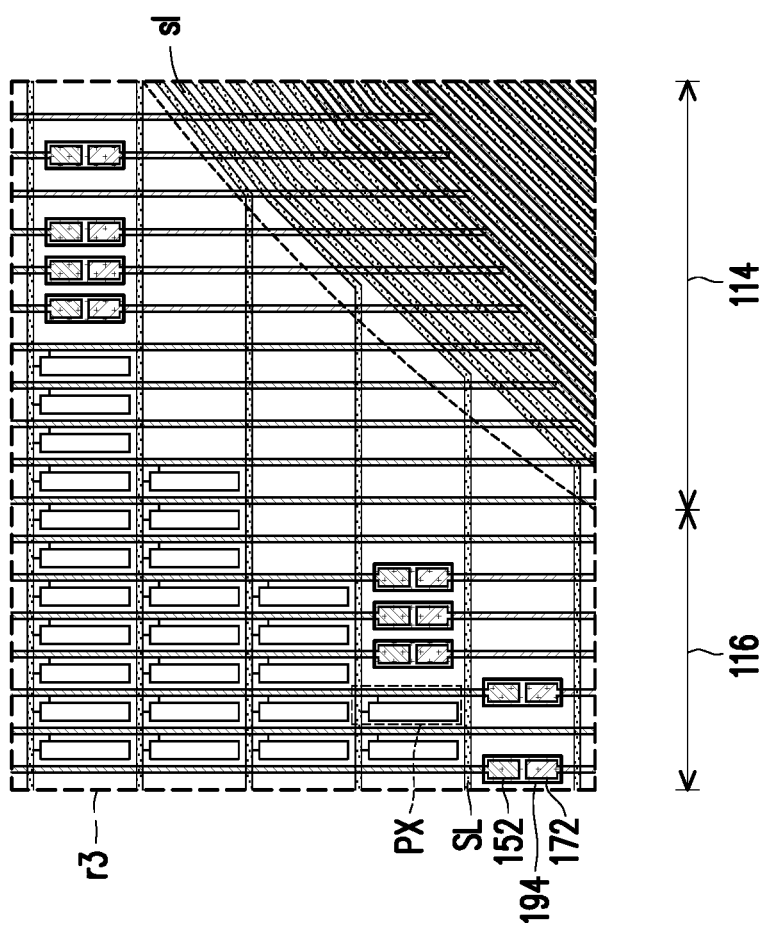
FIG. 15 is a schematic enlarged view of a region r3 of the pixel array substrate 100A depicted in FIG. 12.
Figure 16:
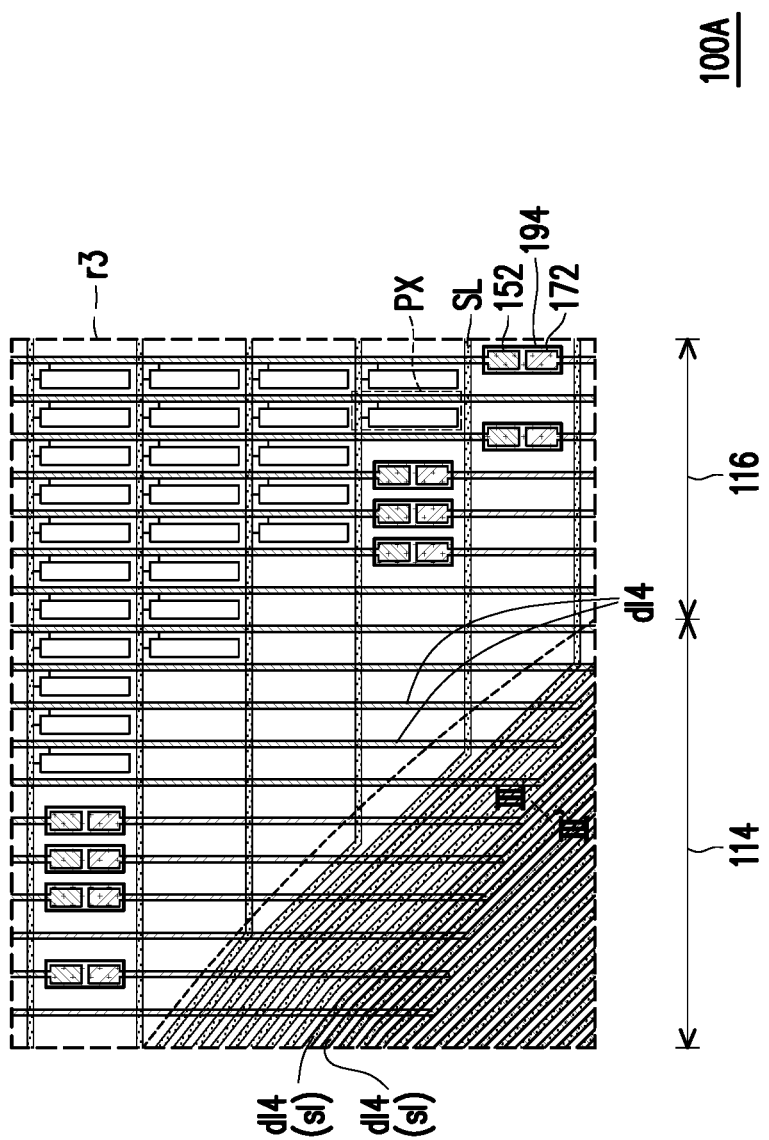
FIG. 16 is a schematic enlarged view of a region r4 of the pixel array substrate 100A depicted in FIG. 12.

FIG. 13 is a schematic enlarged view of a region r1 of the pixel array substrate 100A depicted in FIG. 12. FIG. 14 is a schematic enlarged view of a region r2 of the pixel array substrate 100A depicted in FIG. 12. FIG. 15 is a schematic enlarged view of a region r3 of the pixel array substrate 100A depicted in FIG. 12. FIG. 16 is a schematic enlarged view of a region r4 of the pixel array substrate 100A depicted in FIG. 12.

Figure 17:
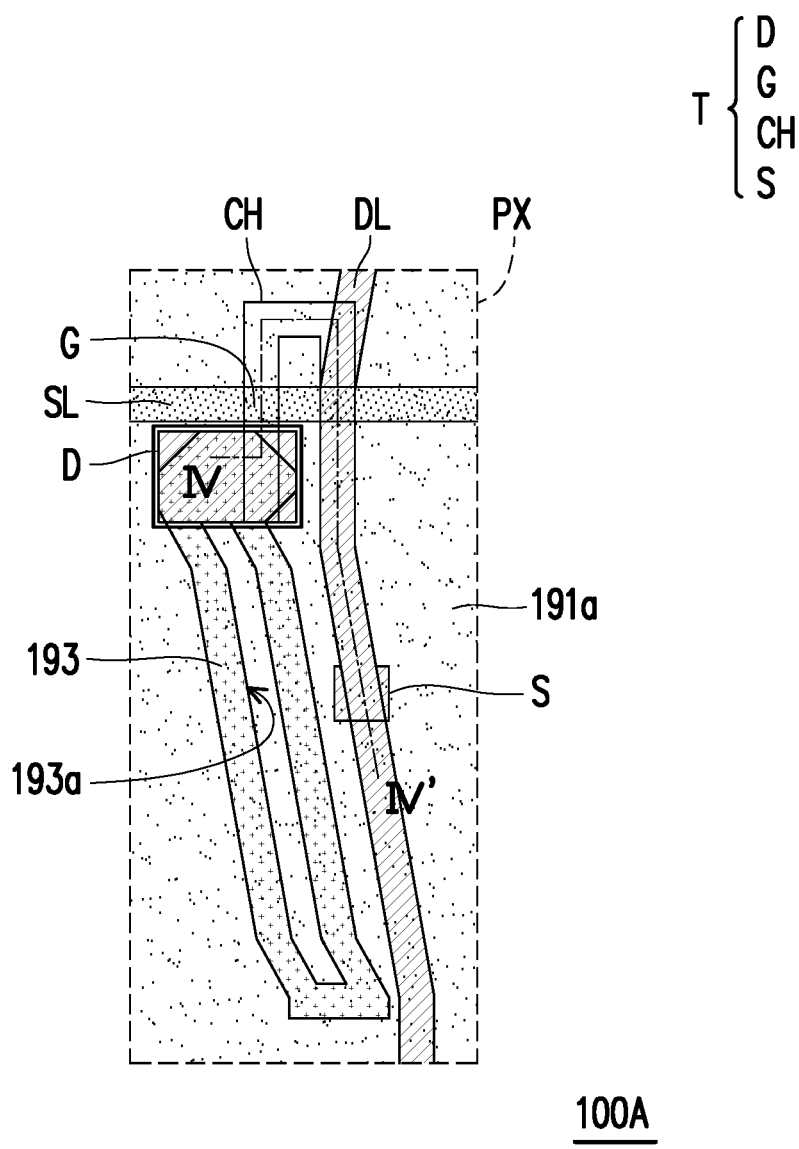
FIG. 17 is a schematic view of a layout of pixels PX of the pixel array substrate 100A according to the second embodiment of the disclosure.

It should be mentioned that FIG. 13 to FIG. 16 schematically illustrate the pixels PX. FIG. 17 is a schematic view of a layout of pixels PX of the pixel array substrate 100A according to the second embodiment of the disclosure. FIG. 17 can be taken as a reference of the layout of the pixels PX depicted in FIG. 13 to FIG. 16.

Figure 18:
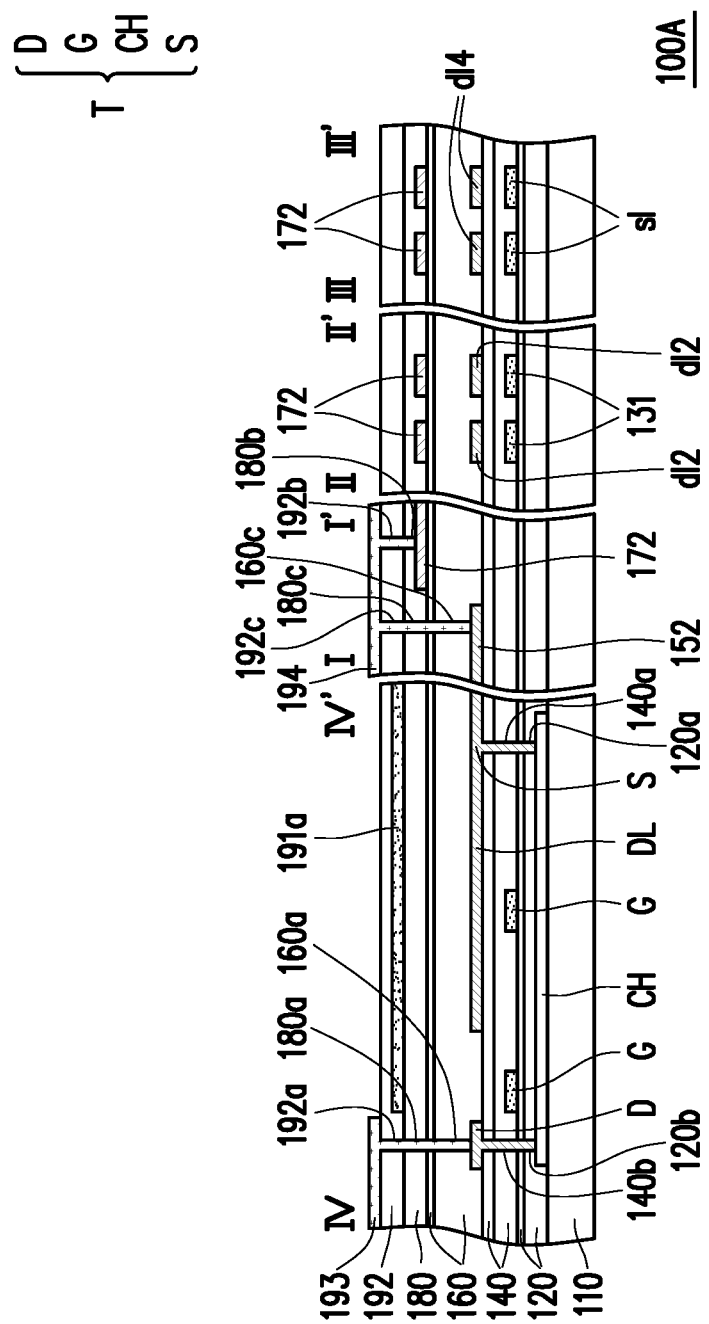
FIG. 18 is a schematic cross-sectional view of the pixel array substrate 100A according to the second embodiment of the disclosure.

FIG. 18 is a schematic cross-sectional view of the pixel array substrate 100A according to the second embodiment of the disclosure. FIG. 18 corresponds to sectional lines I-I' and II-II' in FIG. 13, a sectional line III-III' in FIG. 16, and a sectional line IV-IV' in FIG. 17. Besides, contact windows 140b, 120b, 120a, 140a, 180b, 160c, 180c, 192c, 160a, 180a, and 192a depicted in FIG. 18 are omitted in FIG. 13 to FIG. 17.

With reference to FIG. 12, FIG. 13, and FIG. 14, the difference between the pixel array substrate 100A provided in the second embodiment and the pixel array substrate 100 provided in the first embodiment lies in that the pixel array substrate 100A further includes a third wire group. The third wire group includes a plurality of third connection wires dl3. Functions of the third connection wires dl3 are the same as those of the aforesaid first connection wires dl1, i.e., the third connection wires dl3 are configured to electrically connect the first signal lines DL of the pixels PX respectively located on two opposite sides of the transparent window 112. The difference between the third connection wires dl3 and the first connection wires dl1 lies in the different structures and the locations of the third connection wires dl3 and the first connection wires dl1.

With reference to FIG. 13 and FIG. 18, specifically, in the present embodiment, each of the third connection wires dl3 has a first segment 172 and a second segment 152, a second insulation layer 160 is disposed between the first segment 142 and the second segment 152, and the first segment 172 and the second segment 152 are electrically connected. For instance, the second segments 152 of the third connection wires dl3 can be formed in the second metal layer, the first segments 172 of the third connection wires dl3 can be formed in the third metal layer, which should however not be construed as limitations in the disclosure.

In the present embodiment, the pixel array substrate 100A further includes transfer patterns 194 disposed on the fourth insulation layer 192. For instance, the transfer patterns 194 and the pixel electrode 193 can be selectively formed in the same film layer, and a material of the transfer patterns 194 and a material of the pixel electrode 193 can be the same, which should however not be construed as limitations in the disclosure.

The transfer patterns 194 are electrically connected to the first segments 172 of the third connection wires dl3 through the contact window 192b of the fourth insulation layer 192 and the contact window 180b of the third insulation layer 180. The transfer patterns 194 are electrically connected to the second segments 152 of the third connection wires dl3 through the contact window 192c of the fourth insulation layer 192, the contact window 180c of the third insulation layer 180, and the contact window 160c of the second insulation layer 160. Namely, the first segments 172 and the second segment 152 of the third connection wires dl3 can be electrically connected through the transfer patterns 194.

Note that the first segment 172 of one of the third connection wires dl1 is overlapped with the first segment 131 of one of the first connection wires dl1 and one of the second connection wires dl2. In the present embodiment, one portion of the first segment 172 of one of the third connection wires d31 is substantially aligned to one portion of the first segment 131 of the first connection wire dl1 and one portion of one of the second connection wires dl2.

For instance, in the present embodiment, the third wire group can include a plurality of third connection wires dl3-1, dl3-2, dl3-3, dl3-4, dl3-5, and dl3-6 sequentially arranged along the edge 112a of the transparent window 112. The third connection wire dl3-1 is overlapped with the first segment 131 of the first connection wire dl1-1 and the second connection wire dl2-1. The third connection wire dl3-2 is overlapped with the first segment 131 of the first connection wire dl1-2 and the second connection wire dl2-2. The third connection wire dl3-3 is overlapped with the first segment 131 of the first connection wire dl1-3 and the second connection wire dl2-3. The third connection wire dl3-4 is overlapped with the first segment 131 of the first connection wire dl1-4 and the second connection wire dl2-4. The third connection wire dl3-5 is overlapped with the first segment 131 of the first connection wire dl1-5 and the second connection wire dl2-5. The third connection wire dl3-6 is overlapped with the first segment 131 of the first connection wires dl1-6 and the second connection wire dl2-6.

Since the third connection wires dl3 are overlapped with the first segments 131 of the first connection wires dl1 and the second connection wires dl2, more connection wires dl1, dl2, and dl3 can be arranged within a fixed area, the width W of the wire region 114 can be further reduced, and the visual effects and the screen ratio of the display panel 10A (marked in FIG. 11) can be improved.

In the present embodiment, note that the first segment 172 of one of the third connection wires dl3 is overlapped with the first segment 131 of one of the first connection wires dl1 and one of the second connection wires dl2, the pixels PX electrically connected to the one of the third connection wires dl3, the pixels PX electrically connected to the one of the first connection wires dl1, and the pixels PX electrically connected to the one of the second connection wires dl2 are configured to display the same color, and the one of the third connection wires dl3, the one of the first connection wires dl1, and the one of the second connection wires dl2 have the same polarity.

For instance, the first segment 172 of the third connection wire dl3-1 is overlapped with the first segment 131 of the first connection wire dl1-1 and the second connection wire dl2-1, and the pixels PX electrically connected to the third connection wire dl3-1, the pixels PX electrically connected to the first connection wire dl1-1, and the pixels PX electrically connected to the second connection wire dl2-1 are configured to display a first color and have a first polarity; the first segment 172 of the third connection wire dl3-2 is overlapped with the first segment 131 of the first connection wire dl1-2 and the second connection wire dl2-2, and the pixels PX electrically connected to the third connection wire dl3-2, the pixels PX electrically connected to the first connection wire dl1-2, and the pixels PX electrically connected to the second connection wire dl2-2 are configured to display a second color and have a second polarity; the first segment 172 of the third connection wire dl3-3 is overlapped with the first segment 131 of the first connection wire dl1-3 and the second connection wire dl2-3, and the pixels PX electrically connected to the third connection wire dl3-3, the pixels PX electrically connected to the first connection wire dl1-3, and the pixels PX electrically connected to the second connection wire dl2-3 are configured to display a third color and have the first polarity; the first segment 172 of the third connection wire dl3-4 is overlapped with the first segment 131 of the first connection wire dl1-4 and the second connection wire dl2-4, and the pixels PX electrically connected to the third connection wire dl3-3, the pixels PX electrically connected to the first connection wire dl1-4, and the pixels PX electrically connected to the second connection wire dl2-4 are configured to display the first color and have the second polarity; the first segment 172 of the third connection wire dl3-5 is overlapped with the first segment 131 of the first connection wire dl1-5 and the second connection wire dl2-5, and the pixels PX electrically connected to the third connection wire dl3-5, the pixels PX electrically connected to the first connection wire dl1-5, and the pixels PX electrically connected to the second connection wire dl2-5 are configured to display the second color and have the first polarity; the first segment 172 of the third connection wire dl3-6 is overlapped with the first segment 131 of the first connection wire dl1-6 and the second connection wire dl2-6, and the pixels PX electrically connected to the third connection wire dl3-6, the pixels PX electrically connected to the first connection wire dl1-6, and the pixels PX electrically connected to the second connection wire dl2-6 are configured to display the third color and have the second polarity.

In the present embodiment, an orthogonal projection of at least one transfer pattern 194 (e.g., the transfer patterns 194 electrically connected to the third connection wires dl3-2, dl3-4, and dl3-6) on the substrate 110 is located between the transparent window 112 and the orthogonal projections of the conductive wires sl on the substrate 110. In the present embodiment, an orthogonal projection of at least another transfer pattern 194 (e.g., the transfer patterns 194 electrically connected to the third connection wires dl3-1, dl3-3, and dl3-5) on the substrate 110 is located between the orthogonal projections of the conductive wires sl and the orthogonal projections of the pixels PX on the substrate 110. That is, the orthogonal projections of the transfer patterns 194 on the substrate 110 can be located on both sides of the conductive wires sl. Thereby, more transparent patents 194 can be arranged in a smaller area, and the width W of the wire region 114 can be rapidly reduced effectively.

It will be apparent to those skilled in the art that various modifications and variations can be made to the structure provided in the disclosure without departing from the scope or spirit indicated herein. In view of the foregoing, it is intended that the disclosure cover modifications and variations provided they fall within the scope of the following claims and their equivalents.

What is claimed is:

1. A pixel array substrate comprising:
a substrate having a transparent window, a wire region, and an active region, wherein the wire region is located around the transparent window, and the wire region is located between the active region and the transparent window;
a plurality of pixels disposed at the active region, wherein each of the plurality of pixels comprises a first signal line, a second signal line, an active device, and a pixel electrode, the first signal line and the second signal line are interlaced, the active device is electrically connected to the first signal line and the second signal line, and the pixel electrode and the active device are electrically connected; and
a plurality of connection wires disposed at the wire region, wherein each of the plurality of connection wires is electrically connected to first signal lines of the plurality of pixels located at two opposite sides of the transparent window;
the plurality of connection wires comprising a first wire group, the first wire group comprising a plurality of first connection wires, each of the plurality of first connection wires having a first segment and a second segment, a first insulation layer being disposed between the first segment and the second segment, the first segment and the second segment being electrically connected;
the plurality of connection wires comprising a second wire group, the second wire group comprising a plurality of second connection wires;
the first segment of one of the plurality of first connection wires and one of the plurality of second connection wires being overlapped, the first insulation layer being disposed between the first segment of the one of the plurality of first connection wires and the one of the plurality of second connection wires.

2. The pixel array substrate according to claim 1, wherein the plurality of pixels electrically connected to the one of the plurality of first connection wires and the plurality of pixels electrically connected to the one of the plurality of second connection wires are configured to display one color, and a polarity of the one of the plurality of first connection wires and a polarity of the one of the plurality of second connection wires are the same.

3. The pixel array substrate according to claim 1, further comprising:
a multiplexer comprising a first transistor and a second transistor, wherein the one of the plurality of first connection wires is electrically connected to a first terminal of the first transistor, the one of the plurality of second connection wires is electrically connected to a first terminal of the second transistor, a control terminal of the first transistor is electrically connected to a control terminal of the second transistor, and a second terminal of the first transistor and a second terminal of the second transistor are electrically connected to a plurality of signal terminals, respectively.

4. The pixel array substrate according to claim 1, further comprising:
a plurality of conductive wires disposed at the wire region, wherein each of the plurality of conductive wires is electrically connected to a plurality of second signal lines of the plurality of pixels respectively located on two opposite sides of the transparent window;
the first insulation layer having a first contact window, the first segment and the second segment of the one of the plurality of first connection wires being electrically connected through the first contact window, an orthogonal projection of the first contact window on the substrate being located between the transparent window and a plurality of orthogonal projections of the plurality of conductive wires on the substrate.

5. The pixel array substrate according to claim 1, further comprising:
a plurality of conductive wires disposed at the wire region, wherein each of the plurality of conductive wires is electrically connected to a plurality of second signal lines of the plurality of pixels respectively located on two opposite sides of the transparent window;
the connection wires further comprising a plurality of peripheral wires, an orthogonal projection of the first wire group on the substrate and an orthogonal projection of the second wire group on the substrate being located between a plurality of orthogonal projections of the plurality of peripheral wires on the substrate and the transparent window, the plurality of peripheral wires and the plurality of conductive wires being overlapped.

6. The pixel array substrate according to claim 1, wherein each of the plurality of pixels further comprises a common electrode, the common electrodes of the plurality of pixels are connected to form a touch sensing pad, and the pixel array substrate further comprises:
- a second insulation layer disposed on the one of the plurality of second connection wires;
- a touch trace disposed on the second insulation layer and electrically connected to the touch sensing pad, wherein the touch trace is overlapped with the first segment of the one of the plurality of first connection wires and the one of the plurality of second connection wires.

7. The pixel array substrate according to claim 1, wherein the plurality of connection wires further comprise a third wire group, the third wire group comprises a plurality of third connection wires, each of the plurality of third connection wires has a first segment and a second segment, a second insulation layer is disposed between the first segment and the second segment of each of the plurality of third connection wires, the first segment and the second segment of each of the plurality of third connection wires are electrically connected, and the first segment of one of the plurality of third connection wires is overlapped with the first segment of the one of the plurality of first connection wires and the one of the plurality of the second connection wires.

8. The pixel array substrate according to claim 7, wherein the plurality of pixels electrically connected to the one of the plurality of first connection wires, the plurality of pixels electrically connected to the one of the plurality of second connection wires, and the plurality of pixels electrically connected to the one of the plurality of third connection wires are configured to display one color, and a polarity of the one of the plurality of first connection wires, a polarity of the one of the plurality of second connection wires, and a polarity of the one of the plurality of third connection wires are the same.

9. The pixel array substrate according to claim 7, further comprising:
- a plurality of conductive wires disposed at the wire region, wherein each of the plurality of conductive wires is electrically connected to a plurality of second signal lines of the plurality of pixels respectively located on two opposite sides of the transparent window; and
- a plurality of transfer patterns, wherein each of the plurality of transfer patterns is electrically connected to the first segment and the second segment of one of the plurality of third connection wires, and an orthogonal projection of one of the plurality of transfer patterns on the substrate is located between the transparent window and a plurality of orthogonal projections of the plurality of conductive wires on the substrate.

10. The pixel array substrate according to claim 9, wherein an orthogonal projection of another one of the plurality of transfer patterns on the substrate is located between the plurality of orthogonal projections of the plurality of conductive wires on the substrate and a plurality of orthogonal projections of the plurality of pixels on the substrate.

11. The pixel array substrate according to claim 7, further comprising:
- a transfer pattern electrically connected to the first segment and the second segment of the one of the plurality of third connection wires, wherein a material of the transfer pattern and a material of the pixel electrode are the same.

* * * * *